(12) United States Patent
Eom et al.

(10) Patent No.: US 11,545,536 B2
(45) Date of Patent: Jan. 3, 2023

(54) DISPLAY APPARATUS

(71) Applicant: Samsung Display Co., LTD., Yongin-si (KR)

(72) Inventors: Ji Hye Eom, Hwaseong-si (KR); Dong Wan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 197 days.

(21) Appl. No.: 17/132,616

(22) Filed: Dec. 23, 2020

(65) Prior Publication Data

US 2021/0202665 A1    Jul. 1, 2021

(30) Foreign Application Priority Data

Dec. 31, 2019   (KR) .......................... 10-2019-0179017

(51) Int. Cl.
*H01L 27/32* (2006.01)
*H01L 51/52* (2006.01)

(52) U.S. Cl.
CPC ...... *H01L 27/3276* (2013.01); *H01L 27/3234* (2013.01); *H01L 51/5246* (2013.01); *H01L 51/5281* (2013.01)

(58) Field of Classification Search
CPC ............. H01L 27/3276; H01L 27/3234; H01L 51/5246; H01L 51/5281; H01L 51/52; G02F 1/1345; G02F 1/1339
See application file for complete search history.

(56) References Cited

U.S. PATENT DOCUMENTS

2020/0273927 A1*   8/2020   Oh ........................ H01L 27/326

FOREIGN PATENT DOCUMENTS

| KR | 10-2013-0131017 | 12/2013 |
|----|----|----|
| KR | 10-2020-0121958 | 10/2020 |

* cited by examiner

*Primary Examiner* — Anne M Hines
*Assistant Examiner* — Jose M Diaz
(74) *Attorney, Agent, or Firm* — Kile Park Reed & Houtteman PLLC

(57) ABSTRACT

A display apparatus includes a lower substrate including a display area, a peripheral area and a pad area, a display structure disposed in the display area on the lower substrate, an upper substrate disposed on the display structure, a plurality of driving circuits disposed at a side of the pad area on the lower substrate and spaced apart from each other, a plurality of fan-out wires disposed between the plurality of driving circuits and the display structure in the pad area and the peripheral area on the lower substrate and electrically connecting the plurality of driving circuits and the display structure, and a functional module disposed on a bottom surface of the lower substrate. A first opening is formed in the lower substrate and disposed between adjacent ones of the plurality of fan-out wires, and the first opening and the functional module overlap each other.

17 Claims, 12 Drawing Sheets

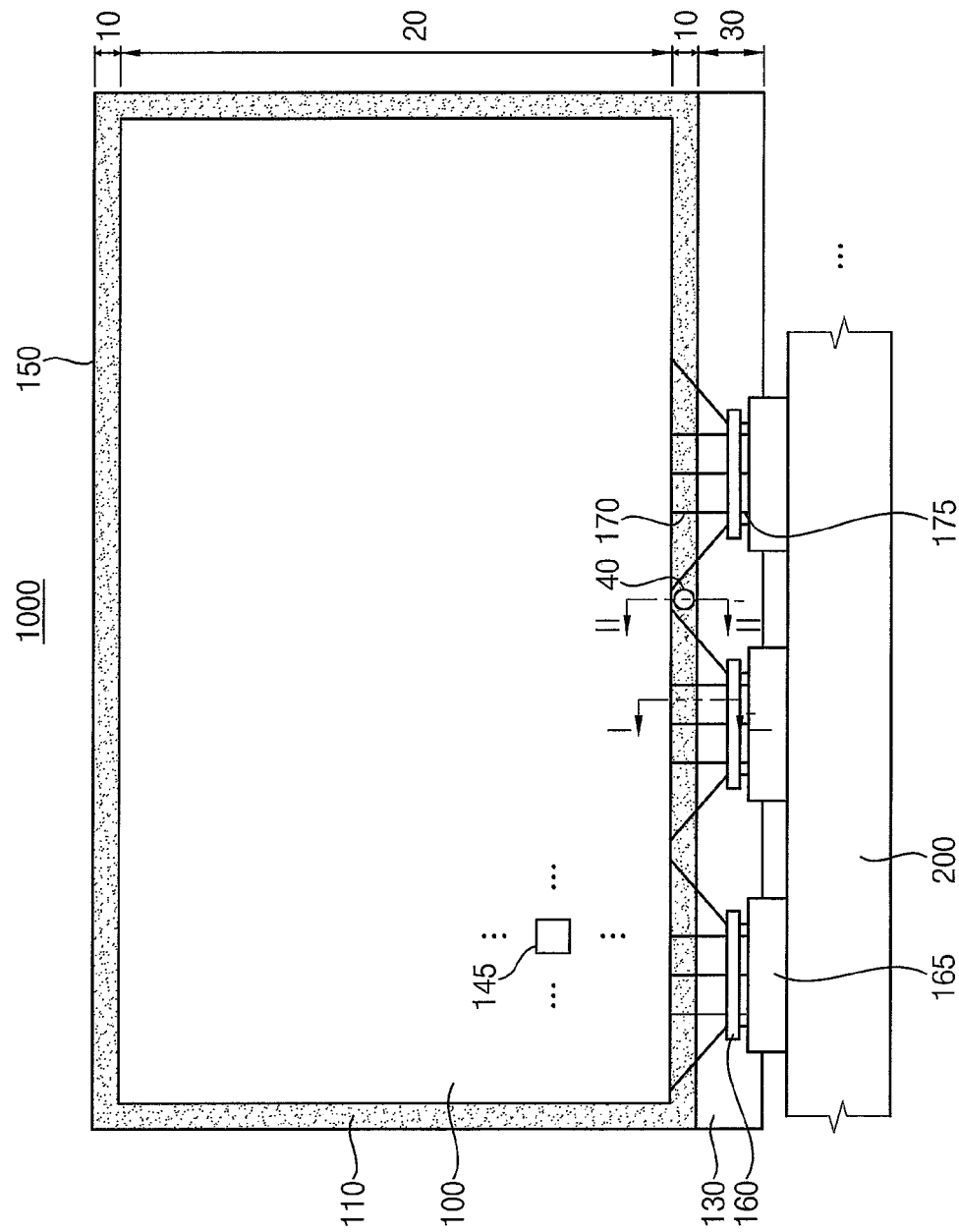

DISPLAY APPARATUS

CROSS-REFERENCE TO RELATED APPLICATION(S)

This application claims priority to and benefits of Korean Patent Application No. 10-2019-0179017 under 35 U.S.C. § 119, filed in the Korean Intellectual Property Office (KIPO) on Dec. 31, 2019, the entire contents of which are incorporated herein by reference.

BACKGROUND

1. Technical Field

Example embodiments of the invention relate to a display apparatus having a functional module.

2. Description of the Related Art

For a long time, conventional cathode ray tube (CRT) devices were widely used with many advantages in terms of performance and price. Eventually display apparatus such as a plasma display apparatus, a liquid crystal display apparatus and an organic light emitting display apparatus attracted attention away from CRT devices. Display apparatus such as the plasma display apparatus, the liquid crystal display apparatus and the organic light emitting display apparatus have overcome many shortcomings of CRT devices in terms of miniaturization or portability.

Attempts have been made to enlarge a display area of the display apparatus. For example, a bezel-less display apparatus, a display apparatus including a notch, and the like have been developed. Recently, a display apparatus has been developed in which a functional module (e.g., camera module, etc.) may be disposed in an opening. The opening may be formed in a peripheral area surrounding the display area and a pad area positioned on one side of the peripheral area. In order to improve the display quality of the display apparatus and enlarge the display area, there is a need for a panel design in consideration of a position where the opening may be formed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Example embodiments may provide a display apparatus having a functional module.

According to an aspect of example embodiments, a display apparatus may include a lower substrate including a display area, a peripheral area adjacent to the display area, and a pad area disposed at a side of the peripheral area, a display structure disposed in the display area on the lower substrate, an upper substrate disposed on the display structure, a plurality of driving circuits disposed at a side of the pad area on the lower substrate and spaced apart from each other, a plurality of fan-out wires disposed between the plurality of driving circuits and the display structure in the pad area and the peripheral area on the lower substrate and electrically connecting the plurality of driving circuits and the display structure and a functional module disposed on a bottom surface of the lower substrate. A first opening may be formed in the lower substrate and disposed between adjacent ones of the plurality of fan-out wires, and the first opening and the functional module may overlap each other.

In example embodiments, the display apparatus may further include a sealing member disposed in the peripheral area between the lower substrate and the upper substrate and a light blocking member disposed between the sealing member and the upper substrate.

In example embodiments, the display apparatus may further include a second opening that overlaps the first opening of the lower substrate and may be formed in the light blocking member.

In example embodiments, the display apparatus may further include a third opening that overlaps the first opening and the second opening and may be formed in the upper substrate.

In example embodiments, the upper substrate may protrude from an outside of the sealing member in a direction from the display structure to the plurality of driving circuits, a portion, which protrudes from the outside of the sealing member, of the upper substrate overlaps the pad area, and the blocking member may be disposed on a bottom surface of the upper substrate protruding from the outside of the sealing member.

In example embodiments, the first opening of the lower substrate may not overlap the light blocking member.

In example embodiments, the display apparatus may further include a light blocking member disposed on the bottom surface of the lower substrate.

In example embodiments, the display apparatus may further include a second opening that overlaps the first opening of the lower substrate and may be formed in the light blocking member.

In example embodiments, the display apparatus may further include a third opening that overlaps the first opening and the second opening and may be formed in the upper substrate.

In example embodiments, the first opening of the lower substrate may not overlap the light blocking member.

In example embodiments, the display apparatus may further include an optical film layer disposed on the upper substrate, a light blocking member disposed in the peripheral area on the optical film layer, and a cover window disposed on the light blocking member and the optical film layer.

In example embodiments, the display apparatus may further include a second opening that overlaps the first opening of the lower substrate and may be formed in the light blocking member.

In example embodiments, the functional module may include one or more of a camera module, a face recognition sensor module, a pupil recognition sensor module, an acceleration sensor module, a proximity sensor module, an infrared sensor module, an illumination sensor module, and an optical sensor module.

According to an aspect of example embodiments, a display apparatus may include a lower substrate including a display area, a peripheral area adjacent to the display area, and a pad area disposed at a side of the peripheral area, a display structure disposed in the display area on the lower substrate, an upper substrate disposed on the display structure, a plurality of gate drivers disposed in a first portion of the peripheral region on the lower substrate, a light blocking member that overlaps the peripheral region of the lower substrate, and a functional module disposed on a bottom surface of the lower substrate. An opening may be formed in the light blocking member, and the opening and the functional module may overlap each other.

In example embodiments, the display apparatus may further include a sealing member disposed in the peripheral area between the lower substrate and the upper substrate. The light blocking member may be disposed between the sealing member and the upper substrate.

In example embodiments, the light blocking member may be disposed on the bottom surface of the lower substrate.

In example embodiments, the display apparatus may further include an optical film layer disposed on the upper substrate and a cover window disposed on the optical film layer. The light blocking member may be disposed between the optical film layer and the cover window.

Accordingly, a non-display area (e.g., the peripheral area, the pad area, etc.) of the display apparatus that may be additionally required for the functional module to be installed may be reduced, and the size and weight of the display apparatus may be reduced.

BRIEF DESCRIPTION OF THE DRAWINGS

Illustrative, non-limiting example embodiments will be more clearly understood from the following detailed description in conjunction with the accompanying drawings.

FIGS. 1A and 1B are schematic plan views illustrating a display apparatus according to example embodiments of the invention.

DETAILED DESCRIPTION OF THE EMBODIMENTS

Figure 1B:
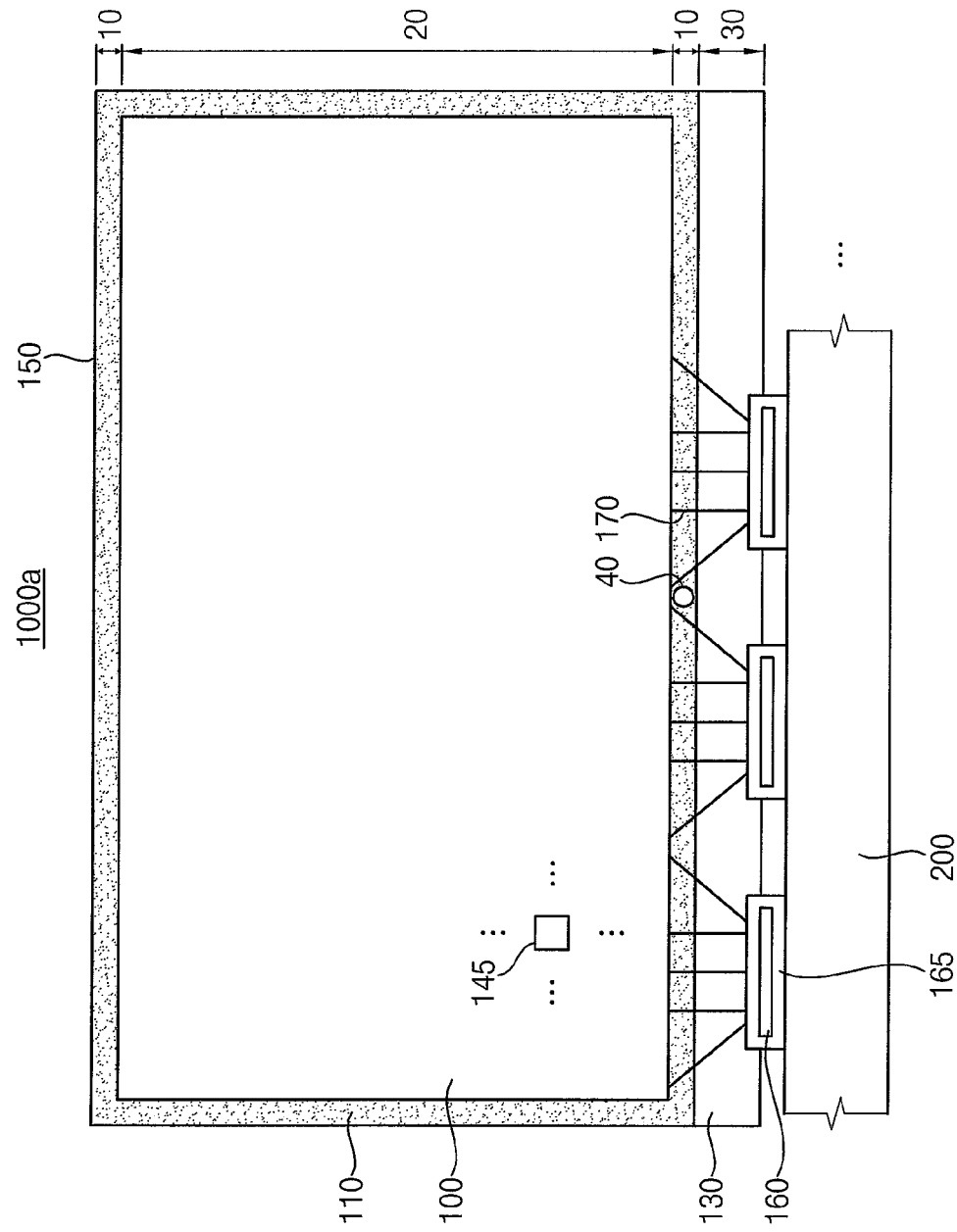

Hereinafter, embodiments of the inventive concept will be explained in detail with reference to the accompanying drawings. The same reference numbers indicate the same components throughout the specification.

In the drawings, sizes and thicknesses of elements may be enlarged for clarity and ease of description thereof. However, the disclosure is not limited to the illustrated sizes and thicknesses.

Use of the singular form (e.g., "a", "an", "the") may include plural forms as well, unless the context clearly indicates otherwise.

When a layer is referred to as being "on" another layer or substrate, it can be directly on the other layer or substrate, or intervening layers may also be present.

It will be further understood that the terms "comprise", "has", "have", and "includes" as used herein specify the presence of stated features or components, but do not preclude the presence or addition of one or more other features or components.

The term "overlap" may include layer, stack, face or facing, extending over, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Components from one embodiment may be available for combination with components from other embodiments.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIGS. 1A and 1B are schematic plan views illustrating a display apparatus according to example embodiments of the invention.

Referring to FIGS. 1A and 1B, the display apparatus 1000, 1000a may include a peripheral area 10, a display area 20, and a pad area 30. Here, the peripheral area 10 may substantially surround the display area 20. The pad area 30 may be located at one side of the peripheral area 10.

In FIGS. 1A and 1B, the pad area 30 is illustrated as being located at a lower side of the display apparatus 1000, but this is merely an example, and the pad area 30 may be located at an upper, left, or right side of the display apparatus 1000.

The display apparatus 1000, 1000a may include a display structure 100, a lower substrate 130, an upper substrate 150, driving circuits 160, fan-out wires 170, a light blocking member 110, and a circuit board 200.

The circuit board 200 may be positioned spaced apart from the pad area 30. The circuit board 200 may be electrically connected to the driving circuits 160 through a connection film 165. The circuit board 200 may receive signals (e.g., a gate signal, a data signal, a power supply voltage, etc.) from an external apparatus. For example, the data signal may be transmitted to the display structure 100 through the fan-out wires 170 and the driving circuits 160, and the gate signal may be transmitted to the display structure 100 through the fan-out wires 170 and the gate driver. The power voltage may be transmitted to the display structure 100 through the fan-out wires 170.

The connection film 165 may be disposed to overlap a portion of the circuit board 200 and a portion of the pad area 30 of the lower substrate 130. The connection film 165 may include a wire 175 (see FIG. 1A). A first end of the wire 175 may be electrically connected to the circuit board 200, and the second end opposite to the first end of the wire 175 may be electrically connected to a pad electrode disposed in the pad area 30 of the lower substrate 130. Here, the pad electrode may be electrically connected to the driving circuits 160. The connection film 165 may include a flexible printed circuit board, a flexible flat cable, and the like. In case that the connection film 165 is bent, the circuit board 200 may be located in a bottom surface of the lower substrate 130.

First to (n+1)th (where n may be a natural number of 1 or more) driving circuits 160 may be disposed on one side of the pad area 30 on the lower substrate 130. The driving circuits 160 may be arranged spaced apart from each other. The driving circuits 160 may transmit a signal received from the wire 175 to the display structure 100. In FIG. 1A, the driving circuits 160 are illustrated in a chip on glass structure, but this is merely an example and may not be limited thereto. For example, as shown in FIG. 1B, the driving circuits 160 may also be disposed in a chip on film structure disposed on the connection film 165. This can also be applied to example embodiments described below.

First to (m+1)th fan-out wires 170 may be disposed between the first to (n+1)th driving circuits 160 and the display structure 100 in the peripheral area 10 and the pad area 30 on the lower substrate 130. The fan-out wires 170 may electrically connect the driving circuits 160 and the display structure 100. The fan-out wires 170 may have a wider distance between the wires as they move from the driving circuits 160 to the display structure 100. That is, the spacing between the wires of the fan-out wires 170 adjacent to the driving circuit 160 may be narrower than the spacing between the wires of the fan-out wires 170 adjacent to the display structure 100. In example embodiments, an opening 40 may be formed to overlap the peripheral area 10 between the fan-out wires 170.

The display structure 100 may be disposed in the display area 20 on the lower substrate 130. The display structure 100 may be electrically connected to the fan-out wires 170. The display structure 100 may receive the signals and display an image on the display area 20.

Figure 2:
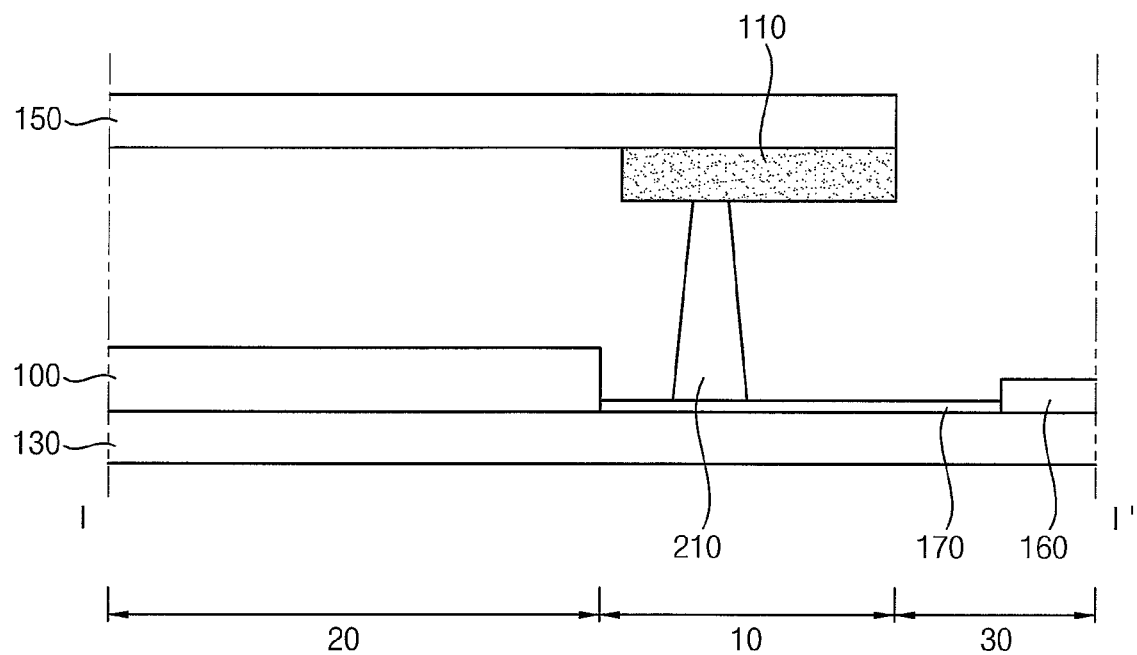
FIG. 2 is a schematic cross-sectional view taken along line I-I' of FIG. 1A.
Figure 3:
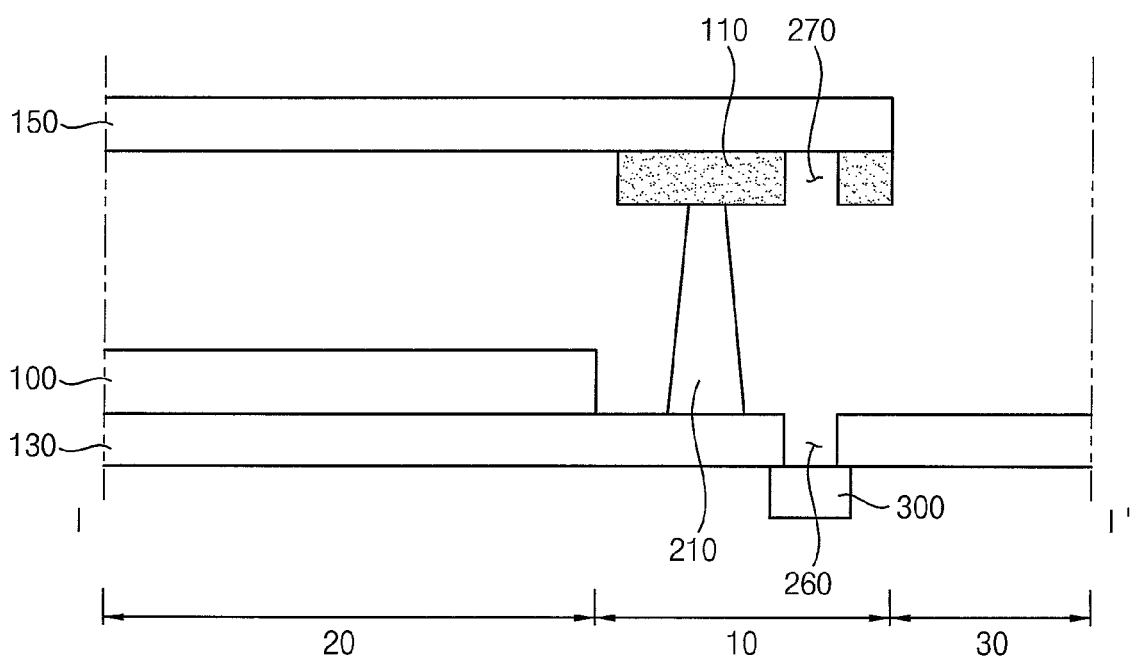
FIG. 3 is a schematic cross-sectional view taken along line II-II' of FIG. 1A.
Figure 4:
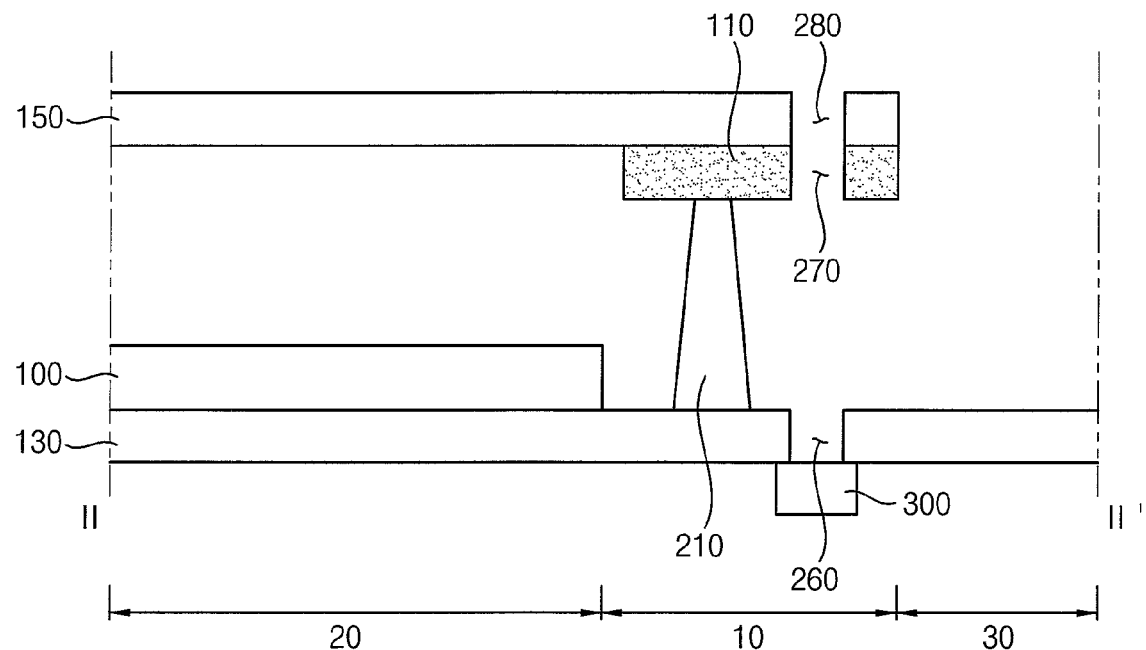
FIG. 4 is a schematic cross-sectional view illustrating an example of an upper substrate included in the display apparatus of FIG. 3.

FIG. 2 is a schematic cross-sectional view taken along line I-I' of FIG. 1A, and FIG. 3 is a schematic cross-sectional view taken along line II-II' of FIG. 1A, and FIG. 4 is a schematic cross-sectional view illustrating an example of an upper substrate included in the display apparatus of FIG. 3.

Referring to FIGS. 2 and 3, the display apparatus 1000 may include the display structure 100, the lower substrate 130, the upper substrate 150, the light blocking member 110, the fan-out wire 170, the driving circuit 160, a sealing member 210, and a functional module 300.

The lower substrate 130 may be made of a transparent or opaque material. For example, the lower substrate 130 may be a quartz substrate, a synthetic quartz substrate, a calcium fluoride substrate, a fluorine-doped quartz substrate, a soda lime glass substrate, a non-alkali glass substrate, and the like, or a combination thereof.

The display structure 100 may be disposed in the display area 20 on the lower substrate 130. The display structure 100 may not overlap the light blocking member 110. In example embodiments, the display structure 100 may include pixels 145. Each of the pixels 145 may include a first electrode, a light emitting layer, and a second electrode. The pixels 145 may be entirely arranged in the display area 20 in a matrix form. In an example embodiment, the display structure 100 may include organic light emitting display components. In another example embodiment, the display structure 100 may include a backlight unit, a liquid crystal layer, and a color filter. However, these are merely examples and the display structure 100 may be configured in various ways.

The driving circuit 160 may be disposed in one side of the pad area 30 on the lower substrate 130. The driving circuit 160 may not overlap the light blocking member 110 and the upper substrate 150. The driving circuit 160 may be disposed to be spaced apart from the display structure 100 and the sealing member 210. However, the driving circuit 160 may be electrically connected to the display structure 100 and the fan-out wire 170.

The upper substrate 150 may be disposed on the lower substrate 130. The upper substrate 150 may protrude from an outside of the sealing member 210 in a direction from the display structure 100 to the driving circuit 160. A portion, which protrudes from the outside of the sealing member 210, of the upper substrate 150 may overlap the pad area 30. The blocking member 110 may be disposed on a bottom surface of the upper substrate 150 protruding from the outside of the sealing member 210. The upper substrate 150 may be disposed on the display structure 100 while partially overlapping the display structure 100.

The upper substrate 150 may be formed of materials substantially the same or similar to the lower substrate 130. That is, the upper substrate 150 may be made of a transparent or opaque material. For example, the lower substrate 130 may include a quartz substrate, a synthetic quartz substrate, a calcium fluoride substrate, a fluorine-doped quartz substrate, a soda lime glass substrate, a non-alkali glass substrate, and the like, or a combination thereof.

The sealing member 210 connecting the lower substrate 130 and the upper substrate 150 may be disposed in the peripheral area 10 between the lower substrate 130 and the upper substrate 150. The sealing member 210 may have a trapezoidal shape in which a width of an upper surface may be smaller than a width of a bottom surface. The sealing member 210 may be disposed in the peripheral area 10 on the lower substrate 130. The sealing member 210 may overlap the lower substrate 130 and the upper substrate 150. The sealing member 210 may contact the fan-out wire 170. The sealing member 210 may not contact the driving circuit 160 and the display structure 100. The sealing member 210, the lower substrate 130, and the upper substrate 150 may seal the display structure 100. The sealing member 210 may prevent external materials (e.g., moisture, dust, etc.) from coming into contact with the display structure 100. Accordingly, it may be possible to prevent the quality of the display apparatus 1000 from deteriorating in case that the display structure 100 contacts the material.

The sealing member 210 may include a frit or the like. Also, the sealing member 210 may additionally include a photo-curable material. For example, the sealing member 210 may include a mixture of an organic material and a photo-curable material, and the mixture may be cured by irradiating ultraviolet (UV), laser light, visible light, or the like to the sealing member 210. The photo-curable material may be an epoxy acrylate-based resin, a polyester acrylate-based resin, a urethane acrylate-based resin, a polybutadiene acrylate-based resin, a silicone acrylate-based resin, alkyl acrylate-based resin, and the like, or a combination thereof.

Although the sealing member 210 has been described as having the trapezoidal shape in which the width of the upper surface may be smaller than the width of the bottom surface, the configuration of the invention is not limited thereto. For example, the sealing member 210 may have a trapezoidal shape in which the width of the upper surface may be larger than the width of the bottom surface, a rectangular shape, a square shape, or the like, or a combination thereof.

The display apparatus 1000 may include the light blocking member 110 disposed between the sealing member 210 and the upper substrate 150. The light blocking member 110 may have a rectangular shape in which a line in the longitudinal direction may be longer than a line in the thickness direction. The light blocking member 110 may partially overlap the upper substrate 150. The light blocking member 110 may partially overlap the sealing member 210. The light blocking member 110 may prevent scattering of light. The light blocking member 110 may be disposed in the peripheral area 10 on the lower substrate 130 to cover the fan-out wire 170 (see FIG. 5).

The light blocking member may include Titanium (Ti), vanadium (V), cobalt (Co), nickel (Ni), zirconium (Zr), niobium (Nb), palladium (Pd), zinc (Zn), chromium (Cr), aluminum (Al), Manganese (Mn), Cadmium (Cd), Magnesium (Mg), Lithium (Li), Selenium (Se), Copper (Cu), Molybdenum (Mo), Hafnium (Hf), Tantalum (Ta), Tungsten (W), Silicon (Si), and the like. These can be used alone or in combination with each other.

Although the light blocking member 110 is described in the rectangular shape in which the line in the longitudinal direction may be longer than the line in the thickness direction, the configuration of the invention is not limited thereto. For example, the light blocking member 110 may have a trapezoidal shape in which a width of the upper surface may be larger than a width of the bottom surface, a trapezoidal shape in which the width of the bottom surface may be larger than the width of the upper surface, a square shape, and the like, or a combination thereof.

A first opening 260 positioned between (k)th (where k may be a natural number between 1 and m) and (k+1)th fan out wires among the first to (m+1)th fan-out wires 170 may be formed on the lower substrate 130. The first opening 260 may be formed in the peripheral area 10. A second opening 270 overlapping the first opening 260 formed on the lower substrate 130 may be formed on the light blocking member 110. The functional module 300 may be disposed to overlap the first opening 260 and the second opening 270. The functional module 300 may be disposed on the bottom surface of the lower substrate 130. Although the functional module 300 is illustrated as being disposed on the bottom surface of the lower substrate 130, this is merely an example and is not limited thereto. For example, the functional module 300 may be disposed on the upper surface of the lower substrate 130, the first opening 260, and the second opening 270. For example, the functional module 300 may include a camera module, a face recognition sensor module, a pupil recognition sensor module, an acceleration sensor module, a proximity sensor module, an infrared sensor module, an illumination sensor module, an optical sensor module, and the like, or a combination thereof.

Referring to FIG. 4, a third opening 280 may be formed in the upper substrate 150 of the display apparatus 1000 of FIG. 3. The third opening 280 may overlap the first opening 260, the second opening 270, and the functional module 300. As the third opening 280 may be formed, transmittance of light entering the functional module 300 may be improved.

Accordingly, additional area required for the display apparatus 1000 in order to install the functional module 300 may be reduced, and the display apparatus 1000 may be reduced in size and weight.

Figure 5:
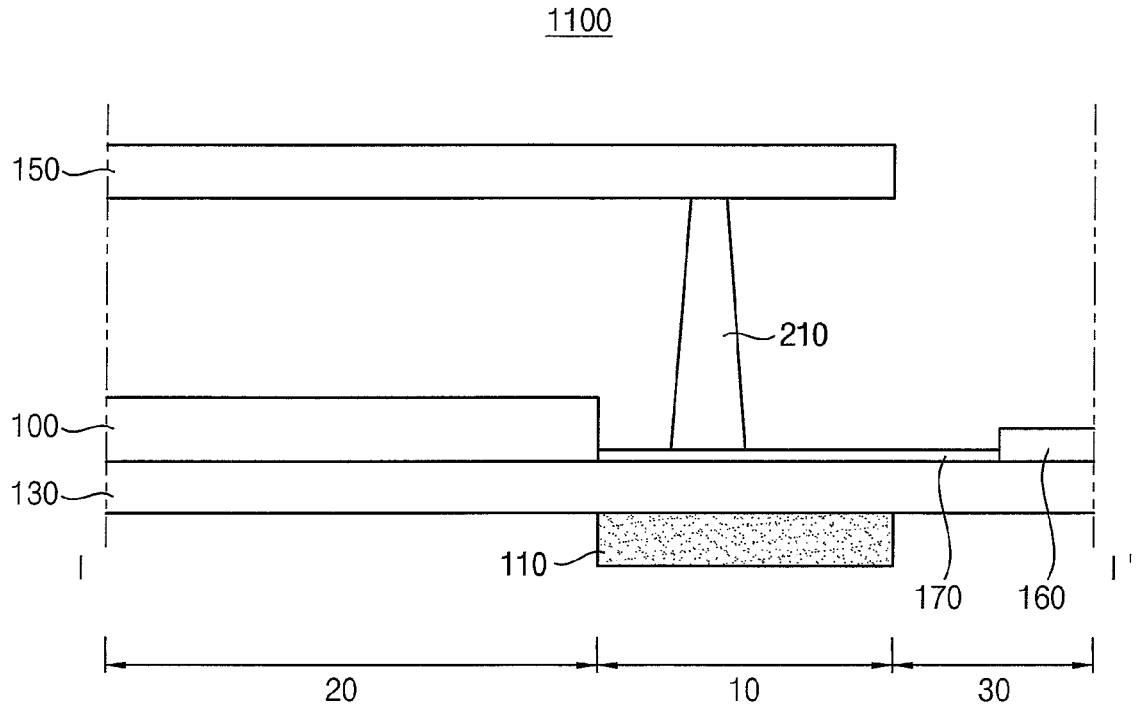
FIGS. 5 and 6 are schematic cross-sectional views illustrating a display apparatus according to example embodiments of the invention.
Figure 6:
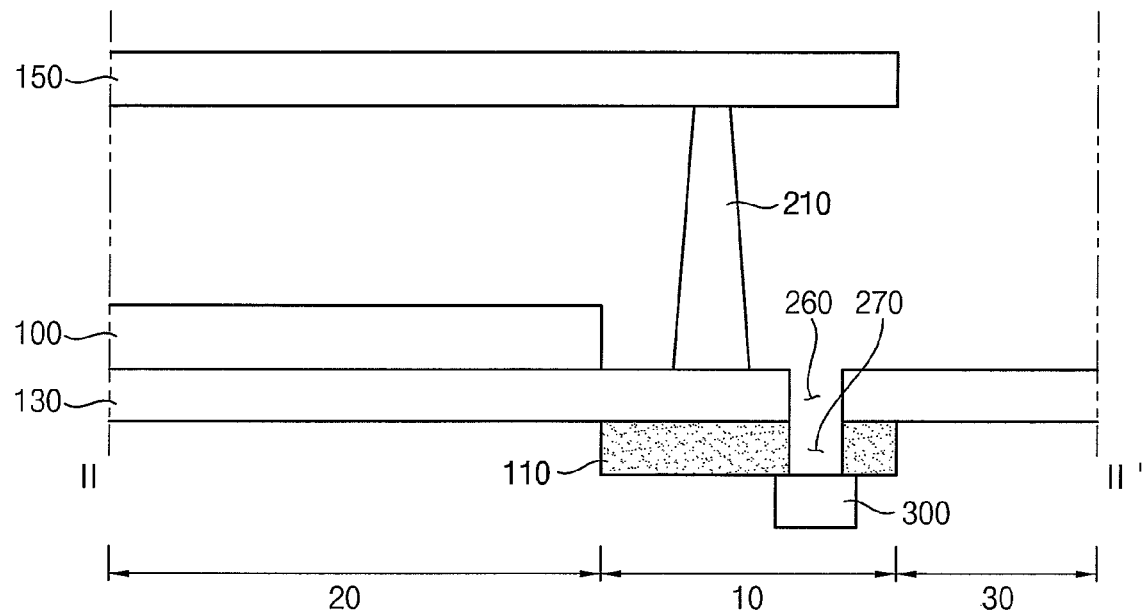
Figure 7:
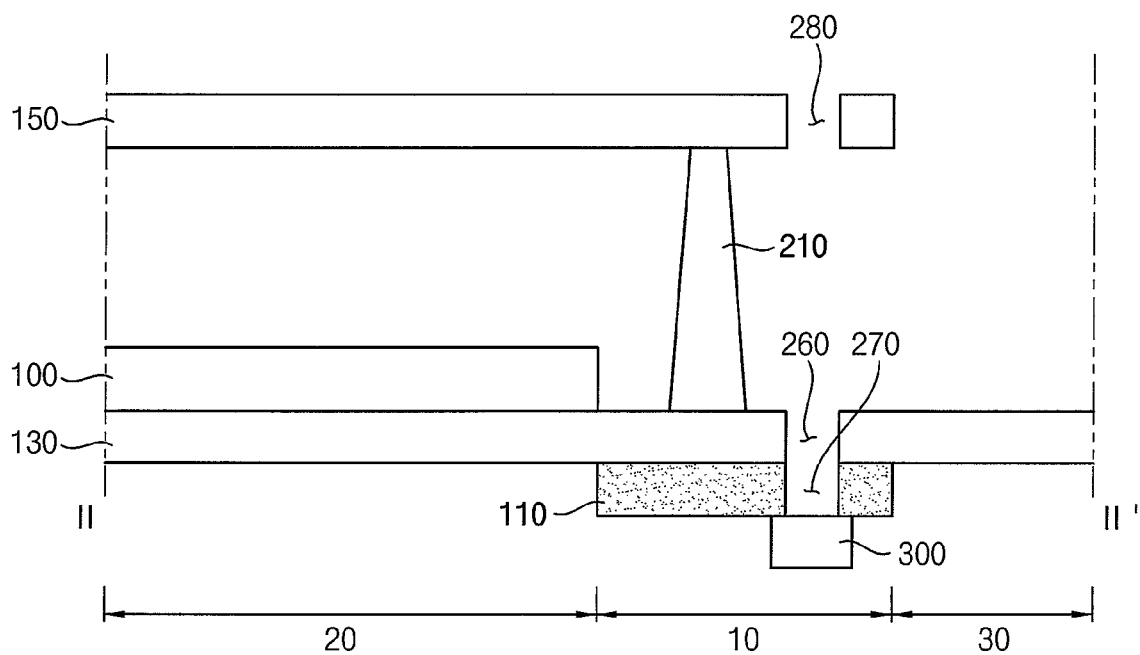
FIG. 7 is a schematic cross-sectional view illustrating an example of an upper substrate included in the display apparatus of FIG. 6.

FIGS. 5 and 6 are schematic cross-sectional views illustrating a display apparatus according to example embodiments of the invention, and FIG. 7 is a schematic cross-sectional view illustrating an example of an upper substrate included in the display apparatus of FIG. 6. The display apparatus 1100 of FIGS. 5 and 6 may be substantially the same or similar to the display apparatus 1000 of FIGS. 2 and 3 except for a position of the light blocking member 110. Therefore, redundant description of similar aspects will be omitted. FIGS. 5 to 7 may correspond to cross-sectional views taken along line II-II of FIG. 1A.

Referring to FIGS. 5 and 6, the light blocking member 110 may be disposed on the bottom surface of the lower substrate 130. The light blocking member 110 may be disposed on the peripheral area 10 of the lower substrate 130. The light blocking member 110 may not contact the upper substrate 150 and the sealing member 210. Also, the light blocking member 210 may not overlap the display structure 100 and the driving circuit 160.

The first opening 260 may be formed in the lower substrate 130. The second opening 270 positioned to overlap the first opening 260 may be formed in the light blocking member 110. The functional module 300 may overlap the first opening 260 and the second opening 270. The functional module 300 may be formed on the bottom surface of the light blocking member 110. However, this is merely an example, and the functional module 300 may be disposed on the upper surface of the lower substrate 130, the first opening 260, the second opening 270, and the like.

Referring to FIG. 7, the third opening 280 may be formed in the upper substrate 150. The third opening 280 may be positioned to overlap the first opening 260, the second opening 270, and the functional module 300. As the third opening 280 may be formed, transmittance of light entering the functional module 300 may be improved.

Accordingly, additional area required for the display apparatus 1100 in order to install the functional module 300 may be reduced, and the display apparatus 1100 may be reduced in size and weight.

Figure 8:
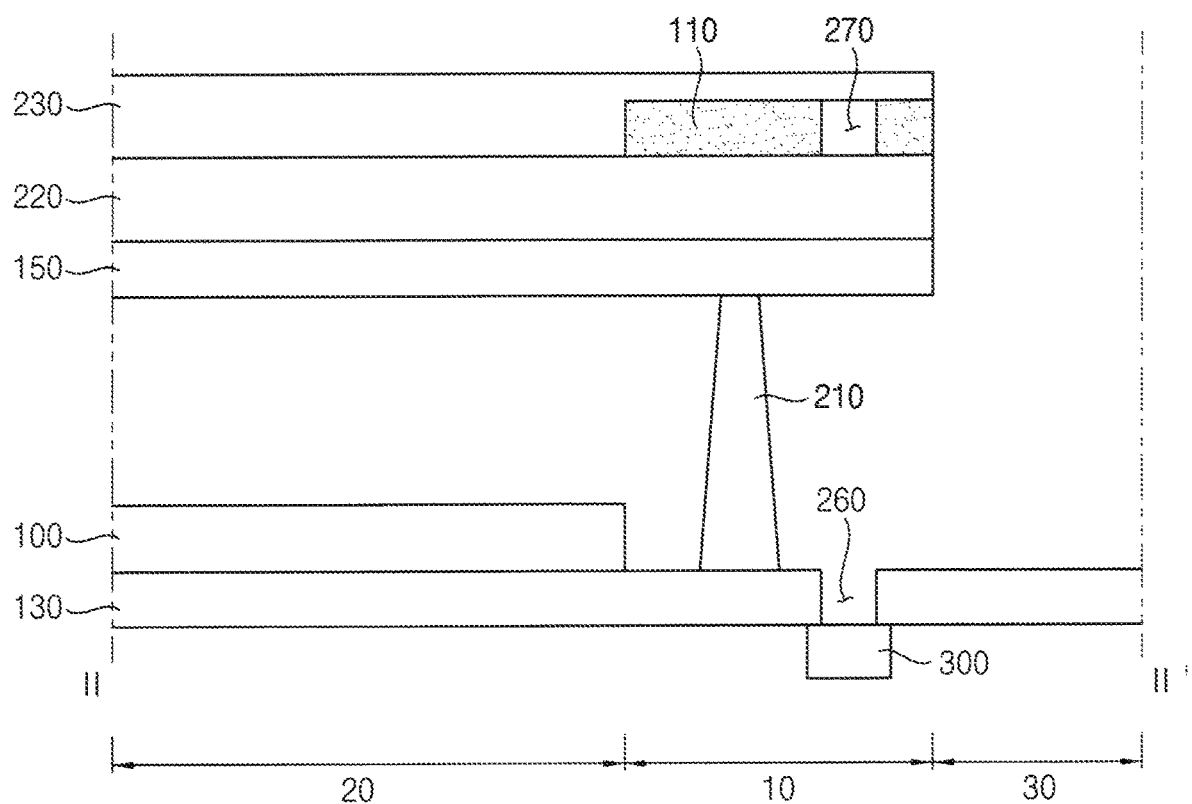
FIG. 8 is a schematic cross-sectional view illustrating a display apparatus according to example embodiments of the invention.

FIG. 8 is a schematic cross-sectional view illustrating a display apparatus according to example embodiments of the invention. FIG. 8 may correspond to a cross-sectional view taken along line II-II of FIG. 1A. The display apparatus 1200 of FIG. 8 may be substantially the same or similar to the display apparatus 1100 of FIG. 6 except that an optical film layer 220 and a cover window 230 may be added and the position of the light blocking member 110 may be changed. Therefore, redundant description of similar aspects will be omitted.

Referring to FIGS. 6 and 8, the display apparatus 1200 of FIG. 8 may further include the optical film layer 220 and the cover window 230.

The optical film layer 220 may be disposed on the upper substrate 150. The optical film layer 220 may overlap the upper substrate 150. The optical film layer 220 may include a polarization layer. The polarization layer may change characteristics of light passing through the optical film layer 220.

The light blocking member 110 may be disposed in the peripheral area 10 on the optical film layer 220. The light blocking member 110 may overlap a portion of the optical film layer 220. The second opening 270 positioned overlapping with the first opening 260 formed on the lower substrate 130 may be formed on the light blocking member 110. Openings positioned to overlap the first opening 260 and the second opening 270 may also be formed in the upper substrate 150, the optical film layer 220, and the cover window 230.

The cover window 230 may be disposed on the light blocking member 110 and the optical film layer 220. The cover window 230 may partially overlap the light blocking member 110 and may also overlap the optical film layer 220 at the same time. The cover window 230 may be formed of a glass material, plastic material, or a combination thereof, but is not limited thereto. Meanwhile, the cover window 230 may be formed of a single layer or a multi-layer in which functional layers may be stacked.

The functional module 300 may overlap the first opening 260 and the second opening 270 and be disposed on the bottom surface of the lower substrate. Although the functional module 300 is described as being disposed on the bottom surface of the lower substrate 130, the configuration of the invention is not limited thereto. For example, the functional module 300 may also be disposed on the upper surface of the lower substrate 130, the first opening 260 and the second opening 270.

Accordingly, additional area required for the display apparatus 1200 to be installed in order to install the functional module 300 may be reduced, and the size and weight of the display apparatus 1200 may be reduced.

Figure 9:
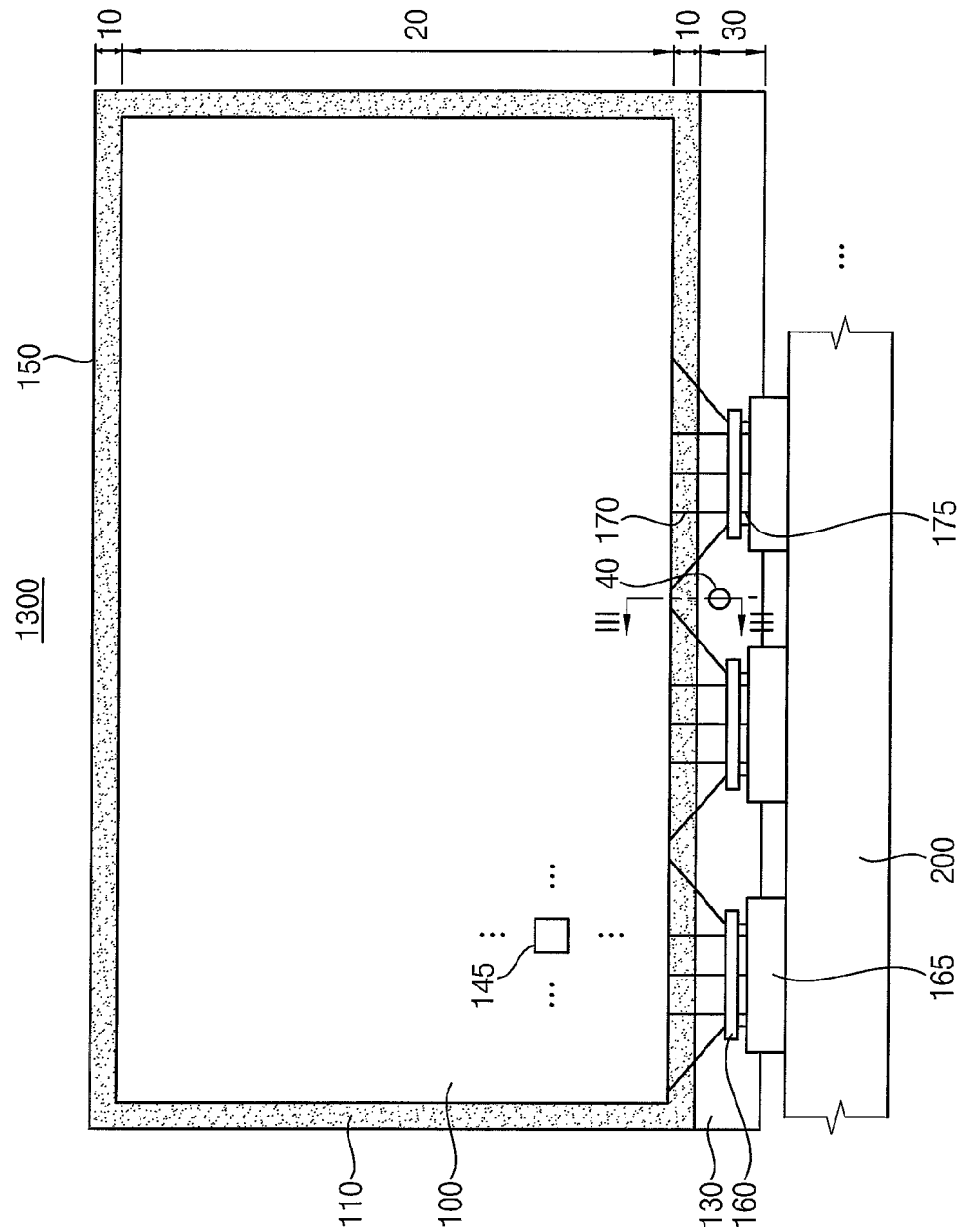
FIG. 9 is a schematic plan view illustrating a display apparatus according to example embodiments of the invention.

FIG. 9 is a schematic plan view illustrating a display apparatus according to example embodiments of the invention. The display apparatus 1300 of FIG. 9 may be substantially the same or similar to the display apparatus 1000 of FIG. 1A except for a position where the opening 40 may be formed. Therefore, redundant description of similar aspects will be omitted.

Referring to FIG. 9, the display apparatus 1300 may include the display structure 100, the lower substrate 130, the upper substrate 150, the driving circuits 160, the fan-out wires 170, the light blocking member 110 and the circuit board 200.

The fan-out wires 170 may be disposed in the peripheral area 10 and the pad area 30 on the lower substrate 130. The fan-out wires 170 may have a wider distance between the wires as they move from the driving circuits 160 to the display structure 100. That is, the spacing between the wires of the fan-out wires 170 adjacent to the driving circuit 160 may be narrower than the spacing between the wires of the fan-out wires 170 adjacent to the display structure 100. In example embodiments, the opening 40 may be formed on the pad area 30 of the lower substrate 130 between the fan-out wires 170.

Figure 10:
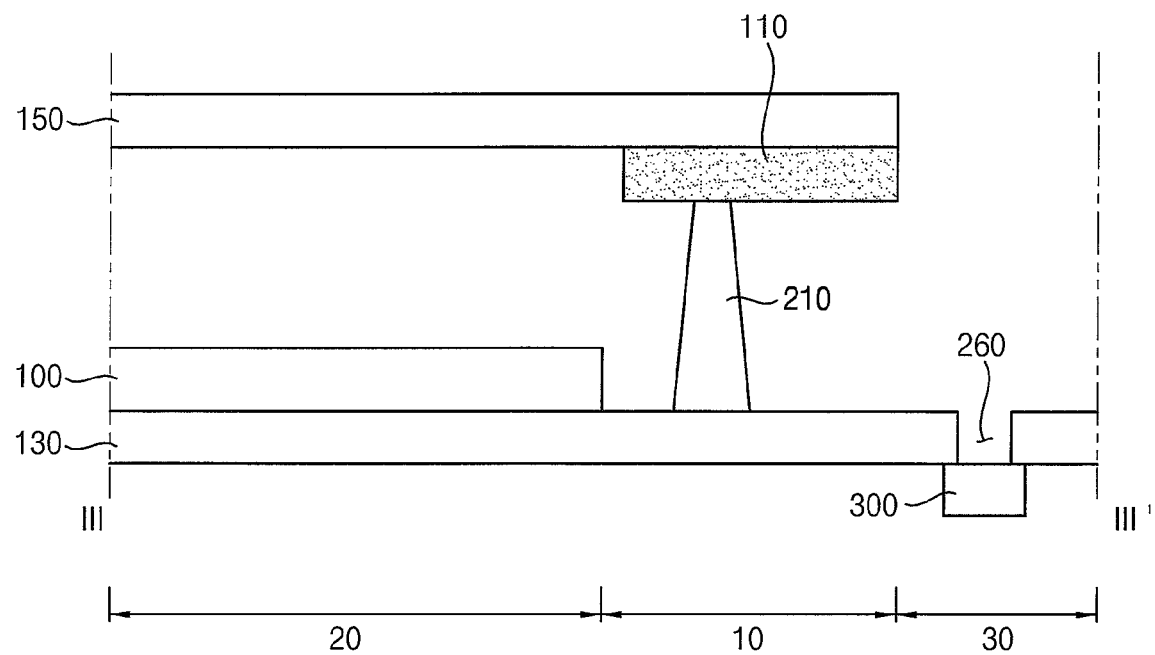
FIG. 10 is a schematic cross-sectional view taken along line III-III' of FIG. 9.
Figure 11:
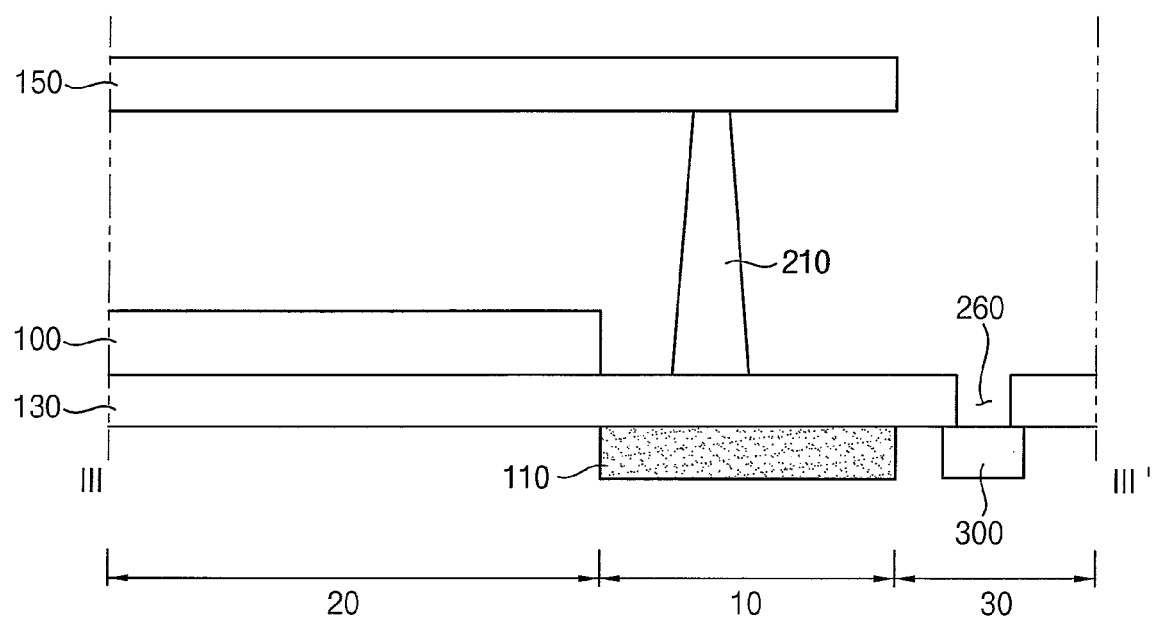
FIG. 11 is a schematic cross-sectional view illustrating an example of a light blocking member included in the display apparatus of FIG. 9.

FIG. 10 is a schematic cross-sectional view taken along line III-III' of FIG. 9, and FIG. 11 is a schematic cross-sectional view illustrating an example of a light blocking member included in the display apparatus of FIG. 9. FIGS. 10 and 11 may correspond to cross-sectional views taken along line III-III' of FIG. 9. The display apparatus 1300 of FIG. 10 may be substantially the same or similar to the display apparatus 1000 of FIG. 3 except for a position of the first opening 260 and a presence or absence of the second opening 270. Therefore, redundant description of similar aspects will be omitted.

Referring to FIG. 10, the display apparatus 1300 may include the display structure 100, the lower substrate 130, the upper substrate 150, the light blocking member 110, the sealing member 210, and the functional module 300.

The display structure 100 may be disposed on the display area 20 of the lower substrate 130. The sealing member 210 may be disposed on the peripheral area 10 of the lower substrate 130. The upper substrate 150 may be disposed on the lower substrate 130. The upper substrate 150 may overlap the display area 20 and the peripheral area 10 of the lower substrate 130.

The light blocking member 110 may be disposed between the upper substrate 150 and the sealing member 210. The light blocking member 110 may overlap the peripheral area 10. The light blocking member 110 may not overlap the pad area 30.

The first opening 260 may be formed in the lower substrate 130. The first opening 260 may be formed in the pad area 30. The first opening 260 may not overlap the upper substrate 150 and the light blocking member 110. Accordingly, the opening may not be formed in the upper substrate 150 and the light blocking member 110.

The functional module 300 may be disposed on the bottom surface of the lower substrate 130 overlapping the first opening 260. Although the functional module 300 has been described as being disposed on the bottom surface of the lower substrate 130, the configuration of the invention is not limited thereto.

Referring to FIG. 11, the display apparatus 1400 of FIG. 11 may be different in the arrangement of the light blocking member 110 from the display apparatus 1300 of FIG. 10. The light blocking member 110 may be disposed on the bottom surface of the lower substrate 130. The light blocking member 110 may be disposed in the peripheral area 10 of the lower substrate 130. The light blocking member 110 may not contact the sealing member 210 and the upper substrate 150. The light blocking member 110 may not overlap the display structure 100.

The functional module 300 may overlap the first opening 260 formed in the pad area 30 of the lower substrate 130. The functional module 300 may not overlap the light blocking member 110 and the upper substrate 150. Although the functional module 300 is described as being disposed on the bottom surface of the lower substrate 130, the configuration of the invention is not limited thereto. For example, the functional module 300 may be located in the upper of the lower substrate 130 and first openings 260. In example embodiments, the optical film layer 220, the cover window 230, and the like of FIG. 8 may be disposed on the upper substrate 150 of FIGS. 10 and 11.

Accordingly, additional area required for the display apparatus 1300 and 1400 in order to install the functional module 300 may be reduced, and the size and weight of the display apparatus 1300 and 1400 may be reduced.

Figure 12:
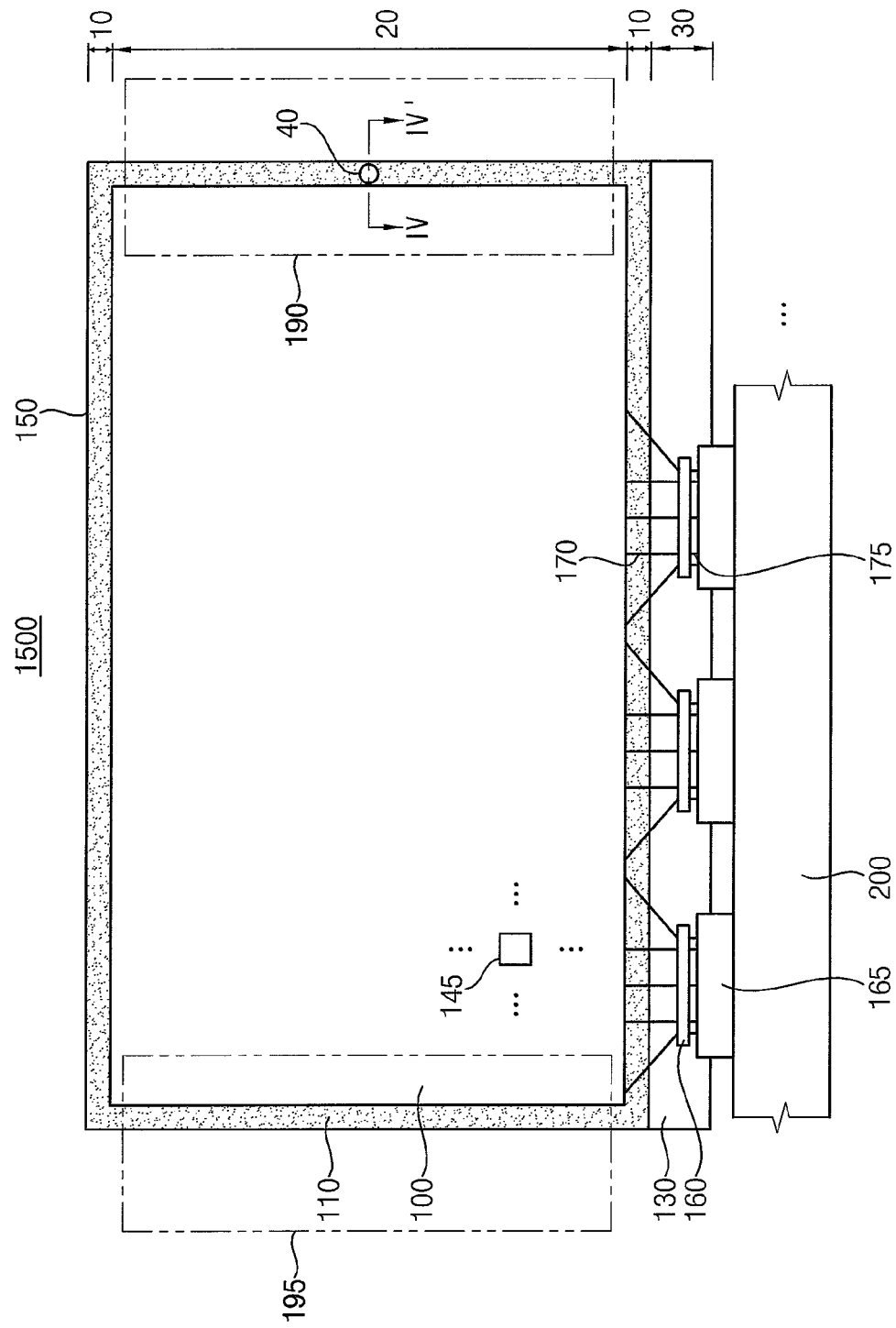
FIG. 12 is a schematic plan view illustrating a display apparatus according to example embodiments of the invention.
Figure 13:
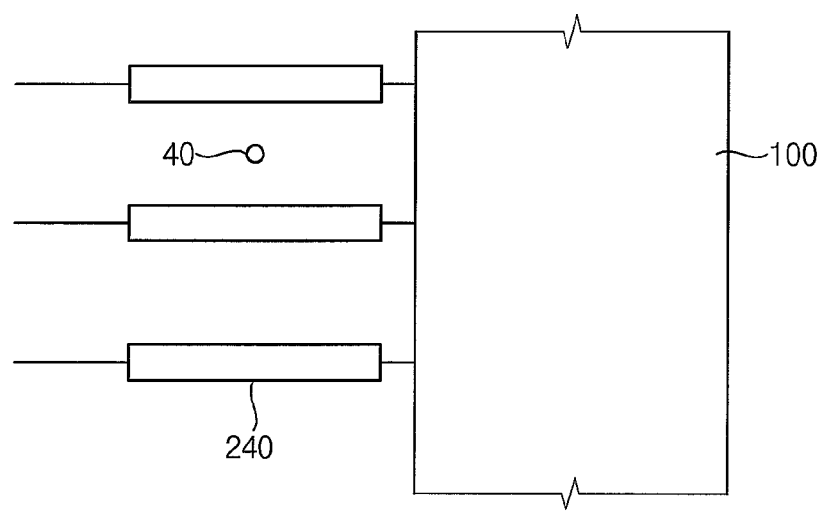
FIGS. 13 and 14 are schematic diagrams for describing a gate driver included in the display apparatus of FIG. 12.
Figure 14:
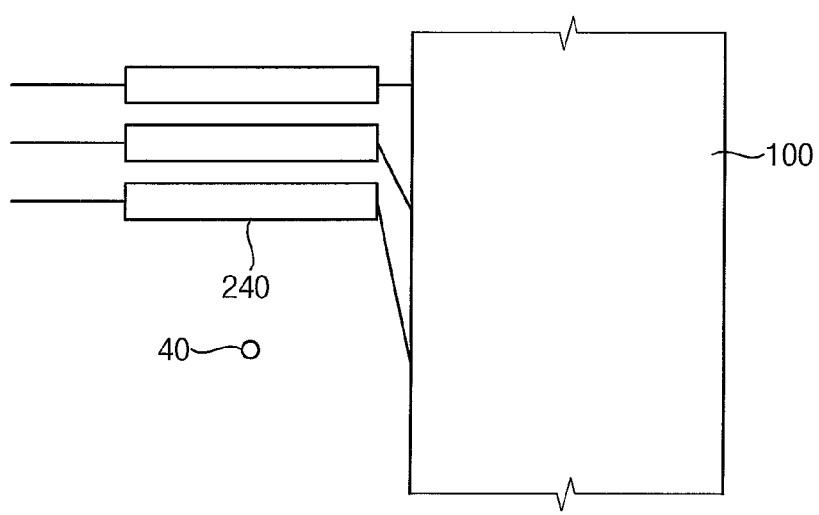

FIG. 12 is a schematic plan view illustrating a display apparatus according to example embodiments of the invention, and FIGS. 13 and 14 are schematic diagrams for describing a gate driver included in the display apparatus of FIG. 12.

The display apparatus 1500 of FIG. 12 may be substantially the same or similar to the display apparatus 1000 of FIG. 1A except for a position where the opening 40 may be formed. Therefore, redundant description of similar aspects will be omitted.

Referring to FIGS. 12 to 14, the display apparatus 1500 may include the display structure 100, the lower substrate 130, the upper substrate 150, the driving circuits 160, the fan-out wires 170, the light blocking member 110, first to (p+1)th (where p may be natural number of 1 or more) gate drivers 240 and the circuit board 200.

The gate driver 240 may transmit a gate signal to the display structure 100. The gate driver 240 may be disposed on the first portion 190 and/or the second portion 195 of the display apparatus 1500.

The opening 40 may be formed to overlap the gate driver 240. The opening 40 may be formed between the (v)th (where v may be a natural number between 1 and p) and (v+1)th gate drivers 240 among the first to (p+1)th gate drivers 240. Also, the first to (p+1)th gate drivers 240 may be disposed on one side of the display structure 100 and the opening 40 may be formed on the opposite side of the one side.

Figure 15:
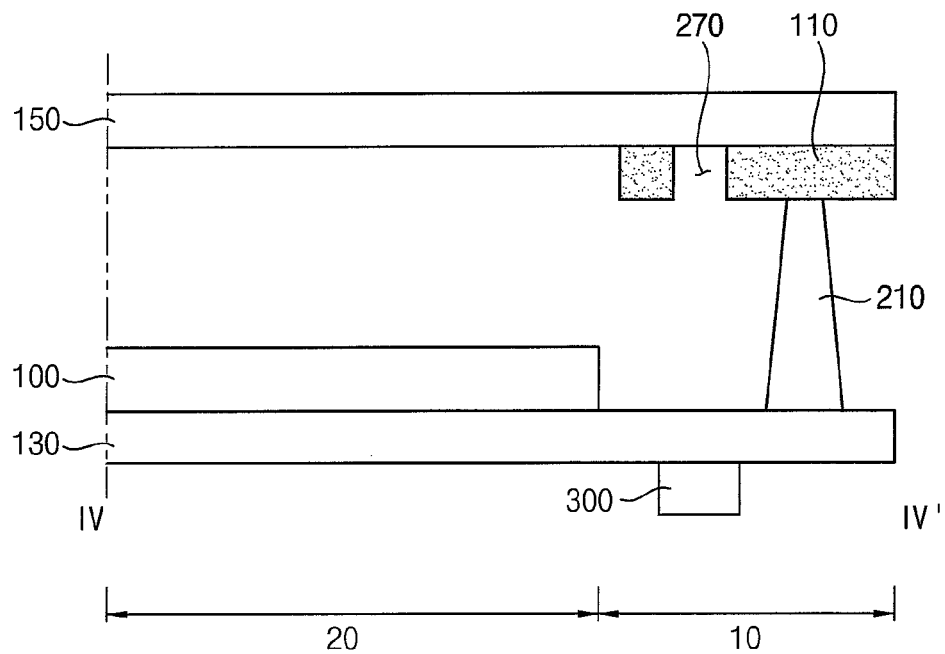
FIG. 15 is a schematic cross-sectional view taken along line IV-IV' of FIG. 12.
Figure 16:
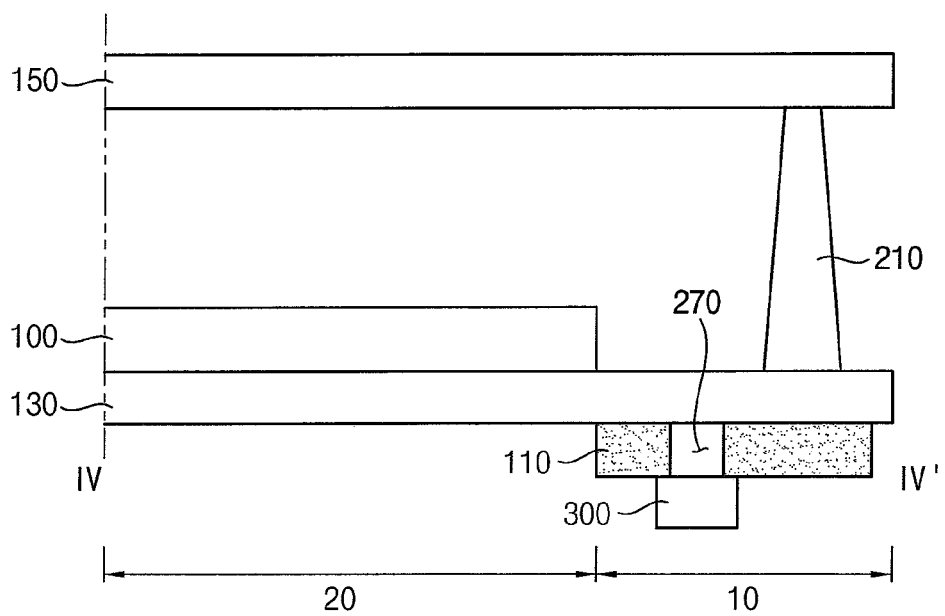
FIG. 16 is a schematic cross-sectional view illustrating an example of a light blocking member included in the display apparatus of FIG. 12.

FIG. 15 is a schematic cross-sectional view taken along line IV-IV' of FIG. 12, and FIG. 16 is a schematic cross-sectional view illustrating an example of a light blocking member included in the display apparatus of FIG. 12. FIG. 16 may correspond to a cross-sectional view taken along line IV-IV of FIG. 12.

Referring to FIG. 15, the display apparatus 1500 may include the display structure 100, the lower substrate 130, the upper substrate 150, the sealing member 210, the light blocking member 110, and the functional module 300.

The lower substrate 130 may include the display area 20 and the peripheral area 10. The display structure 100 may be disposed on the display area 20 of the lower substrate 130. The gate driver and the sealing member 210 may be disposed on the peripheral area 10 of the lower substrate 130. The display structure 100 and the gate driver may contact each other on the lower substrate 130.

The light blocking member 110 may be disposed on the peripheral area 10 of the lower substrate 130. The light blocking member 110 may be disposed between the sealing member 210 and the upper substrate 150. The light blocking member 110 may overlap the gate driver. The second opening 270 may be formed in the light blocking member 110. However, since the second opening 270 may be formed between the gate drivers, the second opening 270 may not overlap the gate driver.

The functional module 300 may be disposed on the bottom surface of the lower substrate 130. The functional module 300 may overlap the second opening 270 and the gate driver 240. In case that the opening may be formed in the lower substrate 130 and the upper substrate 150, the quality of the display apparatus 1500 may deteriorate because the display structure 100 may contact external materials (e.g., dust, moisture, etc.). Therefore, the opening may not be formed in the lower substrate 130 and the upper substrate 150.

Referring to FIG. 16, an arrangement of the light blocking member 110 may be different in the display apparatus 1600 of FIG. 16 when compared to the display apparatus 1500 of FIG. 15. The light blocking member 110 may be disposed on the bottom surface of the lower substrate 130. The light blocking member 110 may be disposed in the peripheral area 10 of the lower substrate 130. The light blocking member 110 may not contact the sealing member 210 and the upper substrate 150. The light blocking member 110 may not overlap the display structure 100.

The functional module 300 may overlap the second opening 270 formed in the light blocking member 110. The functional module 300 may not overlap the light blocking member 110 and the upper substrate 150. In example embodiments, the optical film layer 220 of FIG. 8, the cover window 230, and the like may be disposed on the upper substrate 150 of FIGS. 15 and 16.

Accordingly, additional area required for the display apparatus 1500 and 1600 in order to install the functional module 300 may be reduced, and the size and weight of the display apparatus 1500 and 1600 may be reduced.

Figure 17:
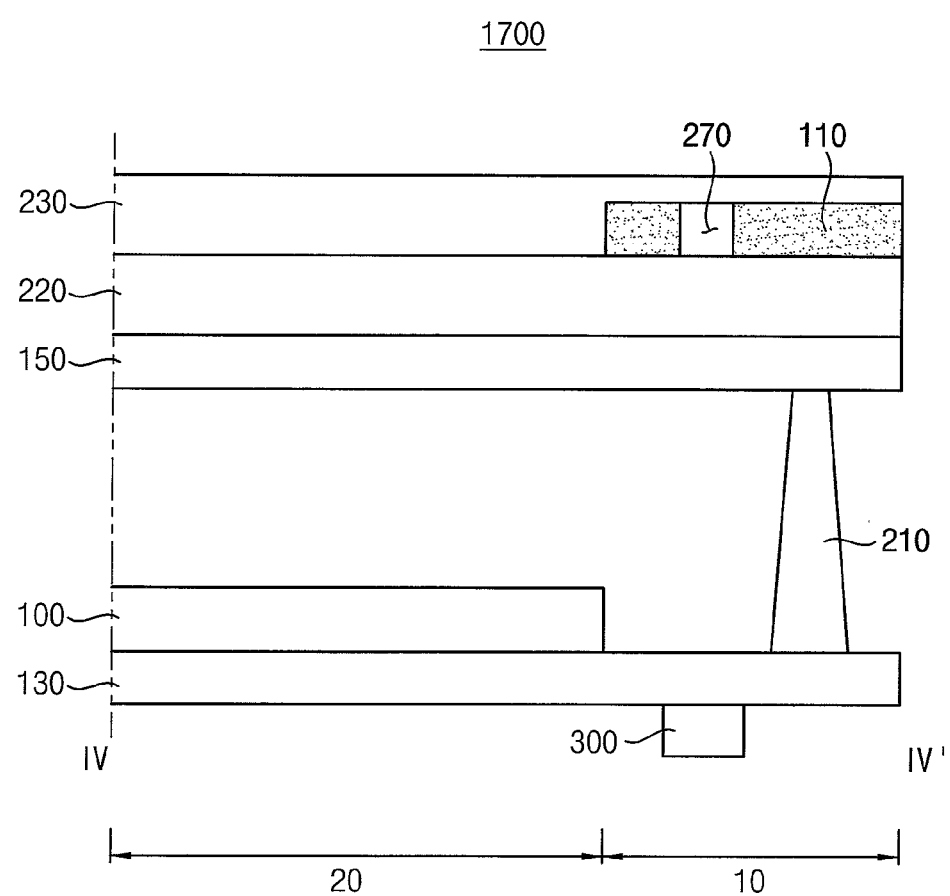
FIG. 17 is a schematic cross-sectional view illustrating a display apparatus according to example embodiments of the invention.

FIG. 17 is a schematic cross-sectional view illustrating a display apparatus according to example embodiments of the invention. FIG. 17 may correspond to a cross-sectional view taken along line IV-IV of FIG. 12. The display apparatus 1700 of FIG. 17 may be substantially the same or similar to the display apparatus 1500 of FIG. 15 except that the optical film layer 220 and the cover window 230 may be added and the position of the light blocking member 110 may be changed. Therefore, redundant description of similar aspects will be omitted.

Referring to FIGS. 15 and 17, the display apparatus 1700 of FIG. 17 may further include the optical film layer 220 and the cover window 230.

The optical film layer 220 may be disposed on the upper substrate 150. The optical film layer 220 may overlap the upper substrate 150. The optical film layer 220 may include the polarization layer. The polarization layer may change characteristics of light passing through the optical film layer 220.

The light blocking member 100 may be disposed between the optical film layer 220 and the cover window 230. The light blocking member 110 may be disposed on one side of the optical film layer 220. The light blocking member 110 may overlap a portion of the optical film layer 220. The second opening 270 may be formed in the light blocking member 110.

The cover window 230 may be disposed on the optical film layer 220. The cover window 230 may partially overlap the light blocking member 110 and may overlap the optical film layer 220 at the same time. The cover window 230 may be formed of the glass material, plastic material, or a combination thereof, but is not limited thereto. Meanwhile, the cover window 230 may be formed of a single layer or a multi-layer in which functional layers may be stacked.

The functional module 300 may overlap the second opening 270 and may be disposed on the bottom surface of the lower substrate 130. Although the functional module 300 is described as being disposed on the bottom surface of the lower substrate 130, the configuration of the invention is not limited thereto. For example, the functional module 300 may also be disposed in the second opening 270.

Accordingly, additional area required for the display apparatus 1500, 1600, and 1700 may be reduced in order to install the functional module 300, and the size and weight of the display apparatus 1500, 1600, and 1700 may be reduced.

The inventive concept may be applied to a display apparatus having a functional module. For example, the inventive concept may be applied to a smart phone, a cellular phone, a video phone, a smart pad, a smart watch, a tablet PC, a car navigation system, a television, a computer monitor, a laptop, a head mounted display apparatus, MP3 player, etc.

The foregoing is illustrative of example embodiments and is not to be construed as limiting thereof. Although example embodiments have been described, those skilled in the art will readily appreciate that many modifications are possible in example embodiments without materially departing from the novel teachings and advantages of the inventive concept. Accordingly, all such modifications are intended to be included within the scope of the inventive concept as defined in the claims including their equivalents.

What is claimed is:

1. A display apparatus comprising:
a lower substrate including a display area, a peripheral area adjacent to the display area, and a pad area disposed at a side of the peripheral area;
a display structure disposed in the display area on the lower substrate;
an upper substrate disposed on the display structure;
a plurality of driving circuits disposed at a side of the pad area on the lower substrate and spaced apart from each other;
a plurality of fan-out wires disposed between the plurality of driving circuits and the display structure in the pad area and the peripheral area on the lower substrate and electrically connecting the plurality of driving circuits and the display structure; and
a functional module disposed on a bottom surface of the lower substrate,
wherein a first opening is formed in the lower substrate and disposed between adjacent ones of the plurality of fan-out wires, and
the first opening and the functional module overlap each other.

2. The display apparatus of claim 1, further comprising:
a sealing member disposed in the peripheral area between the lower substrate and the upper substrate; and
a light blocking member disposed between the sealing member and the upper substrate.

3. The display apparatus of claim 2, further comprising a second opening that overlaps the first opening of the lower substrate and is formed in the light blocking member.

4. The display apparatus of claim 3, further comprising a third opening that overlaps the first opening and the second opening and is formed in the upper substrate.

5. The display apparatus of claim 2, wherein
the upper substrate protrudes from an outside of the sealing member in a direction from the display structure to the plurality of driving circuits,
a portion, which protrudes from the outside of the sealing member, of the upper substrate overlaps the pad area, and
the blocking member is disposed on a bottom surface of the upper substrate protruding from the outside of the sealing member.

6. The display apparatus of claim 2, wherein the first opening of the lower substrate does not overlap the light blocking member.

7. The display apparatus of claim 1, further comprising:
a light blocking member disposed on the bottom surface of the lower substrate.

8. The display apparatus of claim 7, further comprising a second opening that overlaps the first opening of the lower substrate and is formed in the light blocking member.

9. The display apparatus of claim 8, further comprising a third opening that overlaps the first opening and the second opening and is formed in the upper substrate.

10. The display apparatus of claim 7, wherein the first opening of the lower substrate does not overlap the light blocking member.

11. The display apparatus of claim 1, further comprising:
an optical film layer disposed on the upper substrate;
a light blocking member disposed in the peripheral area on the optical film layer; and
a cover window disposed on the light blocking member and the optical film layer.

12. The display apparatus of claim 11, further comprising a second opening that overlaps the first opening of the lower substrate and is formed in the light blocking member.

13. The display apparatus of claim 1, wherein the functional module includes one or more of a camera module, a face recognition sensor module, a pupil recognition sensor module, an acceleration sensor module, a proximity sensor module, an infrared sensor module, an illumination sensor module, and an optical sensor module.

14. A display apparatus comprising:
a lower substrate including a display area, a peripheral area adjacent to the display area, and a pad area disposed at a side of the peripheral area;
a display structure disposed in the display area on the lower substrate;
an upper substrate disposed on the display structure;
a plurality of gate drivers disposed in a first portion of the peripheral region on the lower substrate;
a light blocking member that overlaps the peripheral region of the lower substrate; and
a functional module disposed on a bottom surface of the lower substrate,
wherein an opening is formed in the light blocking member, and the opening and the functional module overlap each other.

15. The display apparatus of claim 14, further comprising:
a sealing member disposed in the peripheral area between the lower substrate and the upper substrate,
wherein the light blocking member is disposed between the sealing member and the upper substrate.

16. The display apparatus of claim 14, wherein the light blocking member is disposed on the bottom surface of the lower substrate.

17. The display apparatus of claim 14, further comprising:
an optical film layer disposed on the upper substrate; and
a cover window disposed on the optical film layer,
wherein the light blocking member is disposed between the optical film layer and the cover window.

* * * * *